US006968101B2

(12) United States Patent
Miller et al.

(10) Patent No.: US 6,968,101 B2
(45) Date of Patent: Nov. 22, 2005

(54) ELECTRODE CONFIGURATION FOR PIANO MEMS MICROMIRROR

(75) Inventors: John Michael Miller, Aylmer (CA); Yuan Ma, Nepean (CA); Barrie Keyworth, Stittsville (CA); Wenlin Jin, Nepean (CA); David R. Hess, Gatineau (CA)

(73) Assignee: JDS Uniphase Inc., Ottawa (CA)

( * ) Notice: Subject to any disclaimer, the term of this patent is extended or adjusted under 35 U.S.C. 154(b) by 0 days.

(21) Appl. No.: 10/850,407

(22) Filed: May 21, 2004

(65) Prior Publication Data

US 2004/0258350 A1 Dec. 23, 2004

Related U.S. Application Data

(63) Continuation-in-part of application No. 10/445,360, filed on May 27, 2003.

(60) Provisional application No. 60/383,106, filed on May 28, 2002, provisional application No. 60/504,210, filed on Sep. 22, 2003, provisional application No. 60/537,012, filed on Jan. 20, 2004, provisional application No. 60/558,563, filed on Apr. 2, 2004.

(30) Foreign Application Priority Data

May 23, 2003 (CA) .................................... 2429508

(51) Int. Cl.$^7$ ............................ G02B 6/35; G02B 26/08
(52) U.S. Cl. .......................... 385/18; 385/16; 359/224; 359/225
(58) Field of Search ................................ 359/223–226, 359/290, 292, 295, 298; 385/16, 18

(56) References Cited

U.S. PATENT DOCUMENTS 6,327,855 B1   12/2001   Hill et al.

(Continued)

FOREIGN PATENT DOCUMENTS

WO          WO01/61400           8/2001         .......... G02B 26/00

(Continued)

OTHER PUBLICATIONS

"Single-Chip 1×84 MEMS Mirror Array for Optical Telecommunication Applications" by Juneau et al, MOEMS and Miniaturized Systems III, James H. Smith, Editor. SPIE vol. 4983 (2003) pp. 53 to 64.

*Primary Examiner*—Rodney Bovernick
*Assistant Examiner*—Omar Rojas
(74) *Attorney, Agent, or Firm*—Teitelbaum & MacLean; Neil Teitelbaum; Doug MacLean

(57) ABSTRACT

A micro-electro-mechanical (MEMs) mirror device for use in an optical switch is disclosed. A "piano"-style MEMs device includes an elongated platform pivotally mounted proximate the middle thereof by a torsional hinge. The middle portion of the platform and the torsional hinge have a combined width less than the width of the rest of the platform, whereby several of these "piano" MEMs devices can be positioned adjacent each other pivotally mounted about the same axis with only a relatively small air gap therebetween. In a preferred embodiment of the present invention specially designed for wavelength switching applications, a greater range of arcuate motion for a mirror mounted thereon is provided by enabling the platform to rotate about two perpendicular axes. The MEMs mirror device according to the preferred embodiment of the present invention enables the mirror to tilt about two perpendicular axes, by the use of an "internal" gimbal ring construction, which ensures that a plurality of adjacent mirror devices have a high fill factor, without having to rely on complicated and costly manufacturing processes.

15 Claims, 23 Drawing Sheets

U.S. PATENT DOCUMENTS

| | | |
|---|---|---|
| 6,442,307 B1 | 8/2002 | Carr et al. |
| 6,491,404 B2 | 12/2002 | Hill |
| 6,529,652 B1 | 3/2003 | Brener |
| 6,533,947 B2 * | 3/2003 | Nasiri et al. .................... 216/2 |
| 6,535,319 B2 | 3/2003 | Buzzetta et al. |
| 6,612,029 B2 * | 9/2003 | Behin et al. ................. 29/847 |
| 6,681,063 B1 * | 1/2004 | Kane et al. ................... 385/18 |
| 6,723,659 B2 * | 4/2004 | Mizuno et al. ............. 438/753 |
| 6,778,728 B2 * | 8/2004 | Taylor et al. ................ 385/18 |
| 2002/0097952 A1 | 7/2002 | Jin et al. |
| 2002/0122217 A1 | 9/2002 | Nakajima |
| 2002/0126455 A1 | 9/2002 | Wood |
| 2003/0012486 A1 | 1/2003 | Ducellier et al. |
| 2003/0035192 A1 | 2/2003 | Mizuno et al. |
| 2003/0052569 A1 | 3/2003 | Dhuler et al. |

FOREIGN PATENT DOCUMENTS

| | | | |
|---|---|---|---|
| WO | WO01/73934 | 10/2001 | ............ H02N 1/00 |

\* cited by examiner

ELECTRODE CONFIGURATION FOR PIANO MEMS MICROMIRROR

CROSS-REFERENCE TO RELATED APPLICATIONS

The present application is a continuation-in-part of U.S. patent application Ser. No. 10/445,360, filed May 27, 2003 which claims priority from U.S. patent application No. 60/383,106 filed May 28, 2002, which are both incorporated herein by reference. The present application also claims priority from U.S. patent applications Nos. 60/504,210 filed Sep. 22, 2003; 60/537,012 filed Jan. 20, 2004; and 60/558,563 filed Apr. 2, 2004, which are all incorporated herein by reference.

TECHNICAL FIELD

The present invention relates to a micro-electro-mechanical (MEMs) mirror device for use in an optical switch, and in particular to an electrode arrangement for a 2d gimbal ring MEMs mirror device.

BACKGROUND OF THE INVENTION

Conventional MEMs mirrors for use in optical switches, such as the one disclosed in U.S. Pat. No. 6,535,319 issued Mar. 18, 2003 to Buzzetta et al, to redirect beams of light to one of a plurality of output ports include an electro-statically controlled mirror pivotable about a single axis. Tilting MEMs mirrors, such as the ones disclosed in U.S. Pat. No. 6,491,404 issued Dec. 10, 2002 in the name of Edward Hill, and U.S. Pat. Publication No. 2003/0052569, published Mar. 20, 2003 in the name of Dhuler et al, which are incorporated herein by reference, comprise a mirror pivotable about a central longitudinal axis, and a pair of electrodes, one on each side of the central longitudinal axis for actuating the mirror. The Dhuler et al reference discloses the positioning of electrodes at an angle to the mirrored platform to improve the relationship between the force applied to the mirror and the gap between the mirror and the electrodes. The MEMs mirror device, disclosed in the aforementioned Hill patent, is illustrated in FIG. 1, and includes a rectangular planar surface 2 pivotally mounted by torsional hinges 4 and 5 to anchor posts 7 and 8, respectively, above a substrate 9. The torsional hinges may take the form of serpentine hinges, which are disclosed in U.S. Pat. No 6,327,855 issued Dec. 11, 2001 in the name of Hill et al, and in U.S. Pat. Publication No. 2002/0126455 published Sep. 12, 2002 in the name of Robert Wood, which are incorporated herein by reference. In order to position conventional MEMs mirror devices in close proximity, i.e. with a high fill factor, fill factor=width/pitch, they must be positioned with their axes of rotation parallel to each other. Unfortunately, this mirror construction restraint greatly restricts other design choices that have to be made in building the overall switch.

When using a conventional MEMs arrangement, the mirror 1 positioned on the planar surface 2 can be rotated through positive and negative angles, e.g. ±2°, by attracting one side 10a or the other side 10b of the planar surface 2 to the substrate 6. Unfortunately, when the device is switched between ports at the extremes of the devices rotational path, the intermediate ports receive light for fractions of a millisecond as the mirror 1 sweeps the optical beam past these ports, thereby causing undesirable optical transient or dynamic cross-talk.

One solution to the problem of dynamic cross-talk is to initially or simultaneously rotate the mirror about a second axis, thereby avoiding the intermediate ports. An example of a MEMs mirror device pivotable about two axes is illustrated in FIG. 2, and includes a mirror platform 11 pivotally mounted by a first pair of torsion springs 12 and 13 to an external gimbal ring 14, which is in turn pivotally mounted to a substrate 16 by a second pair of torsion springs 17 and 18. Examples of external gimbal devices are disclosed in U.S. Pat. No. 6,529,652 issued Mar. 4, 2003 to Brenner, and U.S. Pat. No. 6,454,421 issued Sep. 24, 2002 to Yu et al. Unfortunately, an external gimbal ring greatly limits the number of mirrors that can be arranged in a given area and the relative proximity thereof, i.e. the fill factor. Moreover, the external gimbal ring may cause unwanted reflections from light reflecting off the support frame. These references also require at least four electrodes to actuate each mirror.

Another proposed solution to the problem uses high fill factor mirrors, such as the ones disclosed in U.S. Pat. No. 6,533,947 issued Mar. 18, 2003 to Nasiri et al, which include hinges hidden beneath the mirror platform. Unfortunately, these types of mirror devices require costly multi-step fabrication processes, which increase costs and result in low yields, and rely on four different pairs of electrodes for actuation.

An object of the present invention is to overcome the shortcomings of the prior art by providing a MEMs mirror device that can pivot about perpendicular axes using a limited number of electrodes.

SUMMARY OF THE INVENTION

Accordingly, the present invention relates to a micro-electro-mechanical device mounted on a substrate comprising:

a pivoting member pivotally mounted on said substrate about first and second axes, said pivoting member including a first and a second supporting region on opposite sides of said first axis;

a first hinge extending from said substrate rotatable about the first axis;

a gimbal ring surrounding said first hinge;

a second hinge extending from said gimbal ring to said pivoting member rotatable about the second axis;

a first electrode beneath the first supporting region for pivoting the pivoting member about the first axis;

a second electrode beneath the second supporting region for pivoting the pivoting member about the first axis; and a third electrode beneath a portion of said pivoting member along the first axis, adjacent said second hinge.

BRIEF DESCRIPTION OF THE DRAWINGS

The invention will be described in greater detail with reference to the accompanying drawings which represent preferred embodiments thereof, wherein.

DETAILED DESCRIPTION

Figure 3:
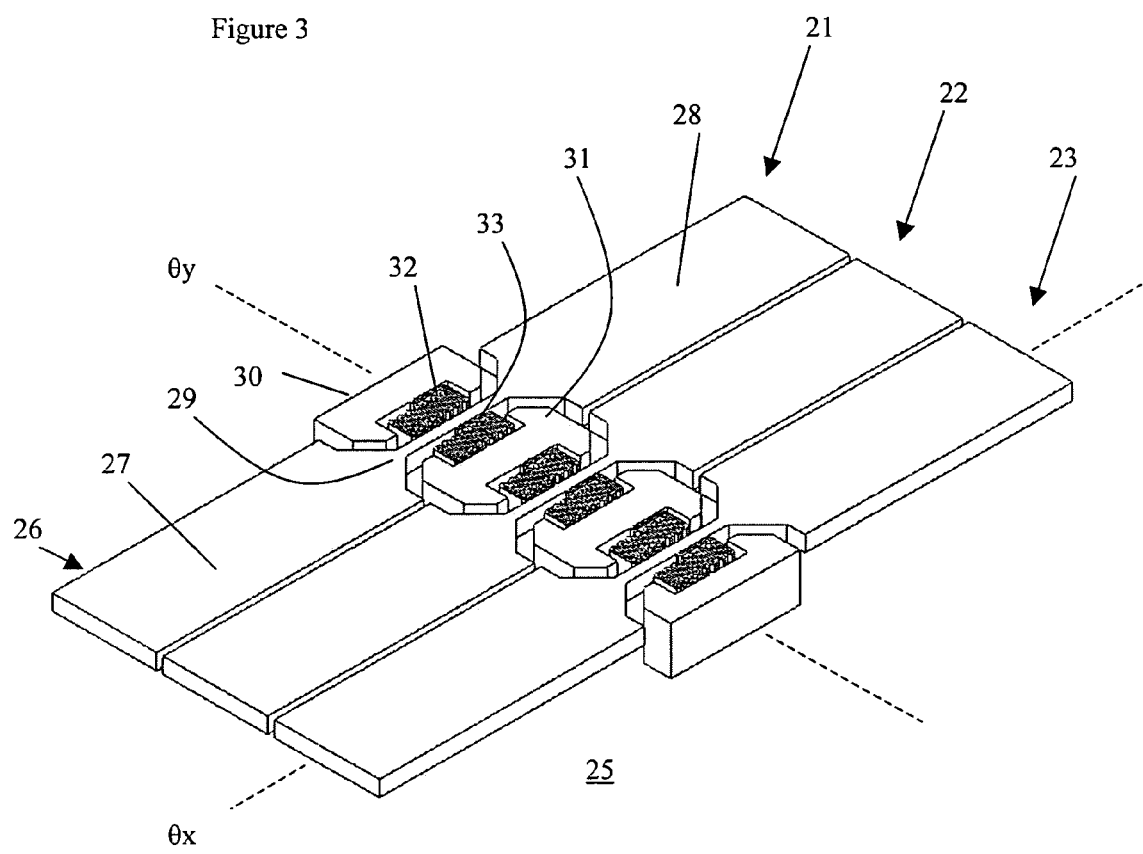
FIG. 3 is an isometric view of a plurality of Piano-MEMs mirror devices.
Figure 4:
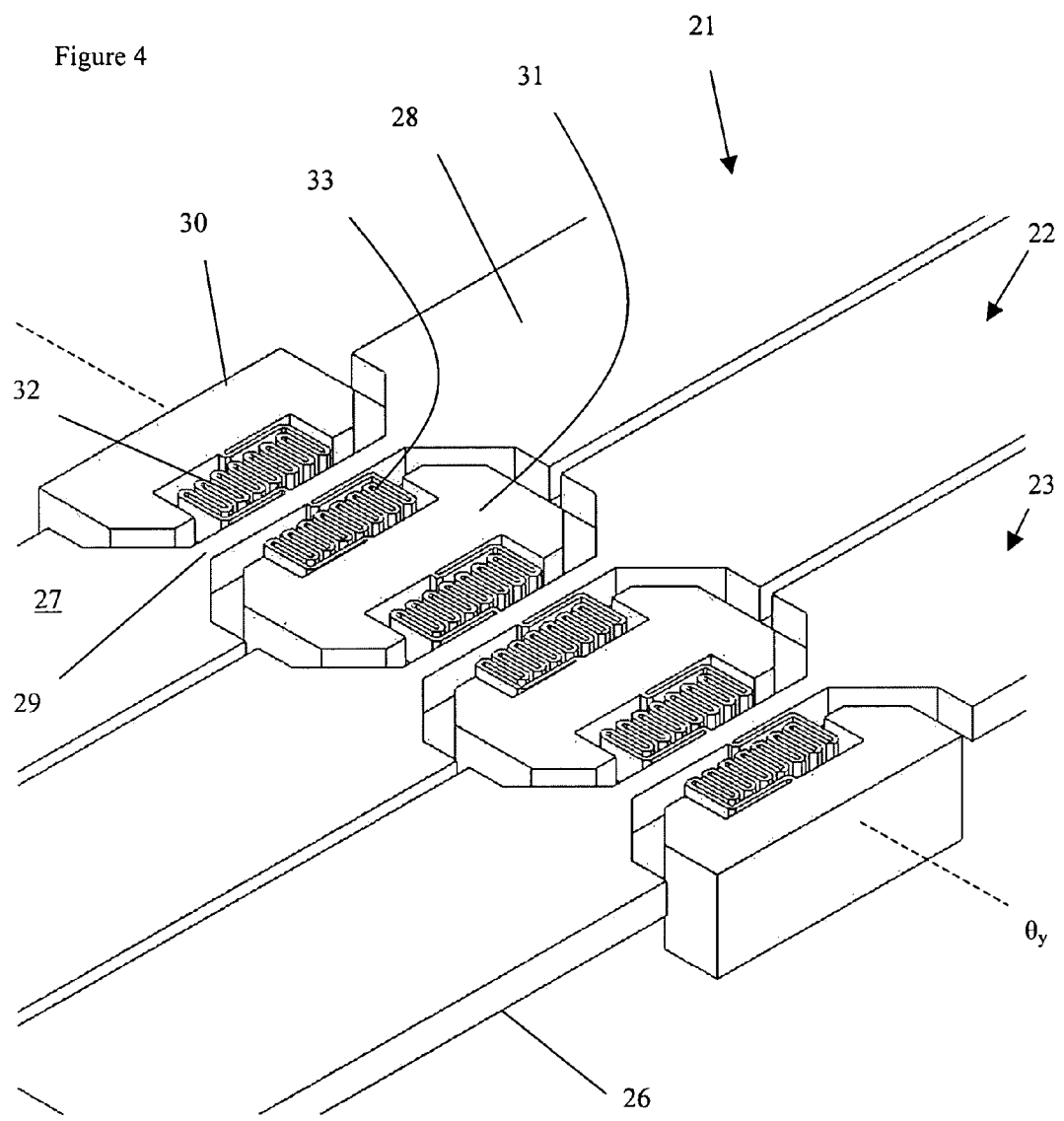
FIG. 4 is an isometric view of a hinge structure of the mirror devices of FIG. 3.
Figure 5:
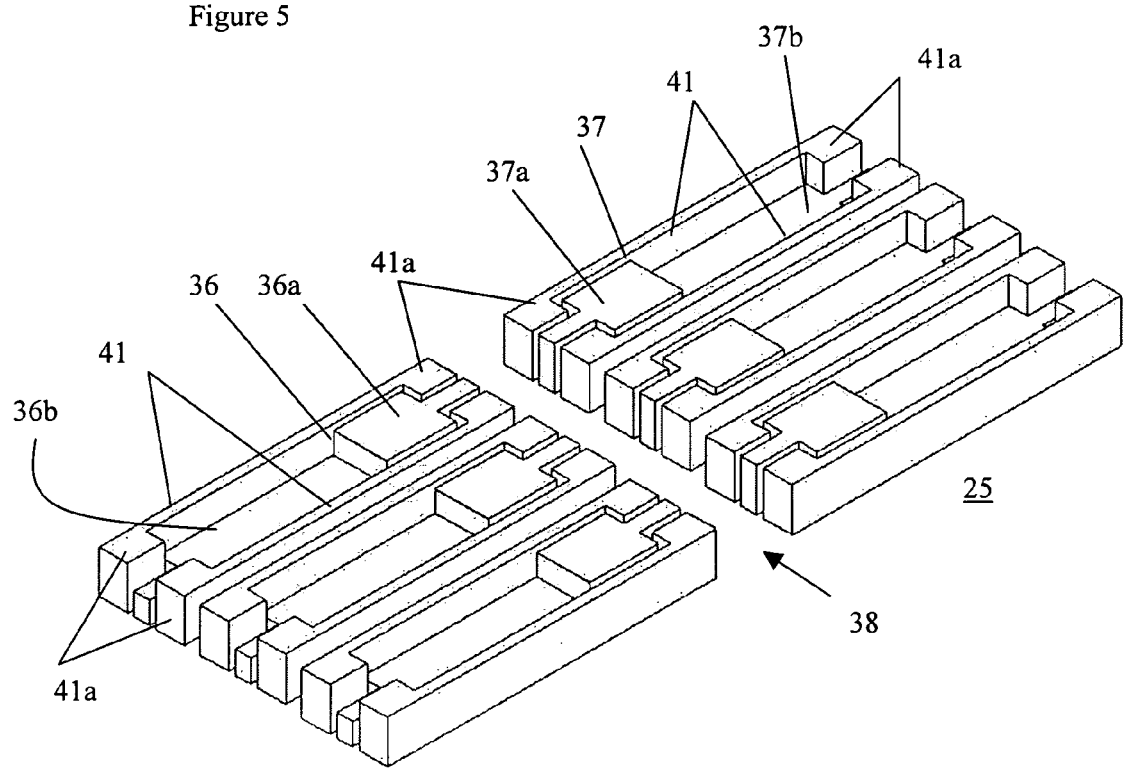
FIG. 5 is an isometric view of an electrode structure of the mirror devices of FIG. 3.

An array of "Piano" MEMs mirror devices 21, 22 and 23, which pivot about a single axis of rotation $\theta_y$ above a substrate 25, is illustrated in FIGS. 3, 4 and 5. Each mirror device 21, 22 and 23 includes a pivoting member or platform 26 defined by first and second substantially-rectangular planar supporting regions 27 and 28 joined by a relatively-thin substantially-rectangular brace 29 extending therebetween. Typically, each planar surface is coated with a reflective coating, e.g. gold, for simultaneously reflecting a pair of sub-beams of light traveling along parallel paths, as will be hereinafter discussed. Each brace 29 acts like a lever and is pivotally mounted to anchor posts 30 and 31 via first and second torsional hinges 32 and 33, respectively. The anchor posts 30 and 31 extend upwardly from the substrate 25. The ends of the first torsional hinge 32 are connected to the anchor post 30 and the brace 29 along the axis $\theta_y$. Similarly, the ends of the second torsional hinge 32 are connected to the anchor post 31 and the brace 29 along the axis $\theta_y$. Preferably, each of the first and second torsional hinges 32 and 33 comprises a serpentine hinge, which are considerably more robust than conventional torsional beam hinges. The serpentine hinge is effectively longer than a normal torsional hinge, which spans the same distance, thereby providing greater deflection and strength, without requiring the space that would be needed to extend a normal full-length torsional hinge.

With particular reference to FIG. 5, each platform 26 is rotated by the selective activation of a first electrode 36, which electro-statically attracts the first planar section 27 theretowards or by the selective activation of a second electrode 37, which electro-statically attracts the second planar section 28 theretowards. A gap 38 is provided between the first and second electrodes 36 and 37 for receiving the anchor posts 31, which extend from the substrate 25 to adjacent the platforms 26.

In the disclosed open loop configuration, the angular position of the platforms 26 depend non-linearly on the voltage applied by the electrodes 36 (or 37), i.e. as the applied voltage is increased linearly, the incremental change in angular platform position is greater as the voltage increases. Accordingly, there is a maximum voltage, i.e. an angular platform position, at which the platform angular position becomes unstable and will uncontrollably tilt until hitting part of the lower structure, e.g. the electrode 36. This maximum voltage sets the range of angular motion that the platform 26 can travel. The instability in the platform's angular position is a result of the distance between the platform 26 and the electrode 36 (the hot electrode) decreasing more rapidly at the outer free ends of the platform 26 than at the inner sections, nearer the pivot axis $\theta_y$, As a result, the force per unit length along the platform 26 increases more rapidly at the outer free ends of the platform 26 than the inner sections. To increase the platform's range of angular motion, the field strength, i.e. the force per unit area, that is sensed at the outer free ends of the platform 26 must be reduced. With reference to FIGS. 5, this is accomplished by providing the electrodes 36 and 37 with a two-step configuration. Upper steps 36a and 37a are positioned proximate the inner end of the platform 26, i.e. the Y axis, while lower steps 36b and 37b are positioned under the outer free ends of the platform 26, thereby making the gap between the platforms 26 and the electrodes 36 and 37 greater at the outer free end than the inner end. The area of the lower steps 36b and 37b can also be made smaller, thereby reducing the force per unit area sensed by the outer free end of the platform 26. Multi-step electrodes, e.g. three or more can also provide a more even distribution of force.

A consequence of closely packed micro-mirrors is that the actuation of a single mirror will impart a torque, i.e. an angular rotation, onto adjacent mirrors as a result of fringing electric fields. In an effort to minimize this cross-talk, electrode grounding shields 41 are positioned on the substrate 25 around or on either side of the first and second electrodes 36 and 37 forming electrode cavities, which are electrically isolated from each other. FIG. 5 illustrates C-shaped grounding shields 41, which include lateral portions 41a for partially surrounding the first and second electrodes 36 and 37. The grounding shields 41 are kept at ground potential, i.e. the same as the mirrored platforms 26, while one of the first and second electrodes is held at an activation voltage, e.g. 100 Volts.

Trace lines 36c and 37c electrically connect the electrodes 36 and 37, respectively, to a voltage supply (not shown). Since the trace lines 36c and 37c also act as a hot electrode, i.e. contributing to the total torque applied to the platform 26, covering the traces 36c and 37c with a ground plane 43 (FIG. 6) also reduces the force applied to the outer free end of the platform 26.

Figure 6:
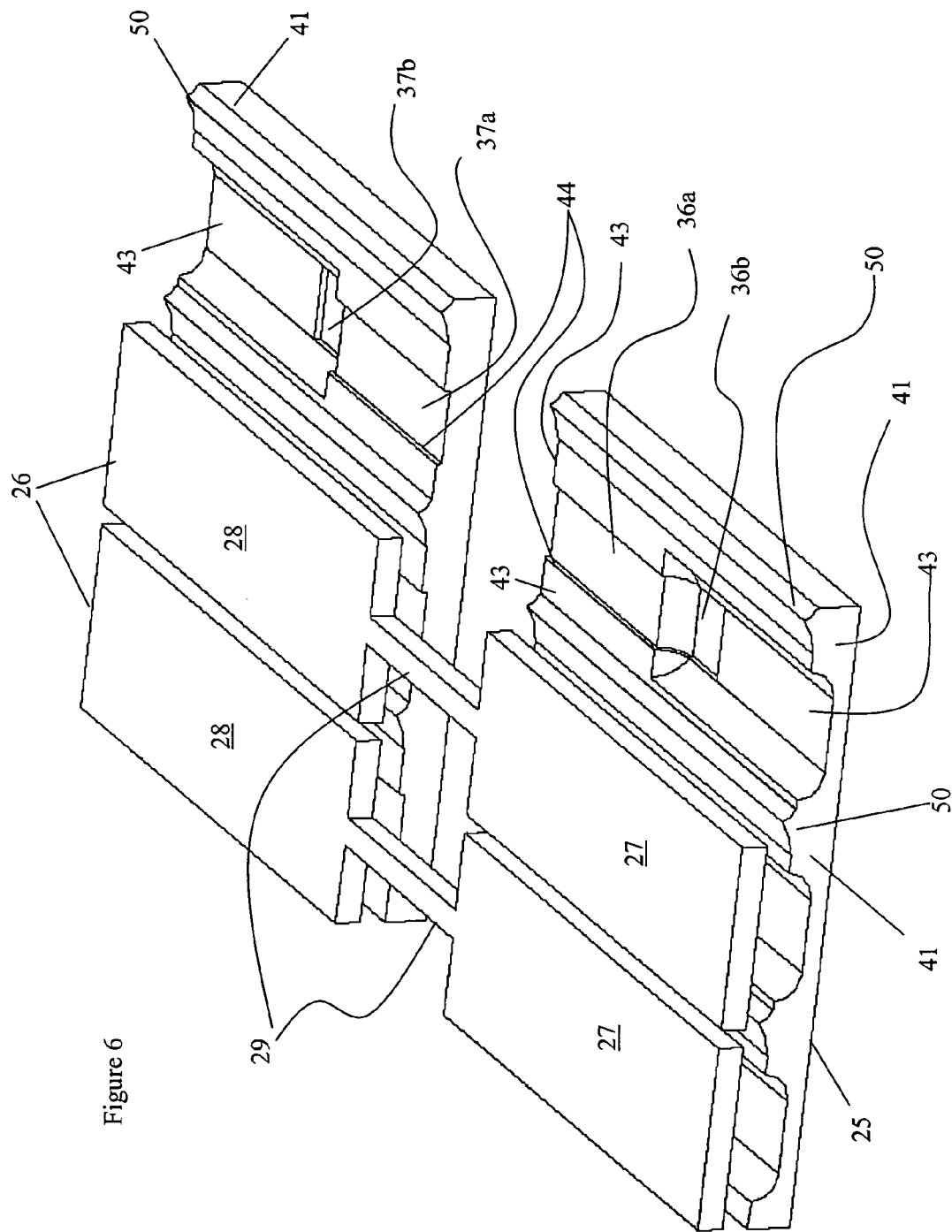
FIG. 6 is an isometric view of a plurality of Piano-MEMs mirror devices according to an alternative embodiment of the present invention with electrode shields, light redirecting cusps, and a raised ground plane.

FIG. 6 also illustrates an alternative configuration for the electrode 36, in which the two step hot electrode 36 is sunken slightly below a surrounding grounded metallic surface, which is a continuation of the ground plane 43. A small vertical step 44 between the hot electrode 36 and the surrounding ground plane 43 is a dielectric surface that isolates the hot electrode 36 from the surrounding ground plane 43. This arrangement reduces the angular drift of the platform 26, which is caused by a build up of electrostatic charges on exposed dielectric or insulating surfaces. The electric field generated by these electrostatic charges perturbs the electric field generated by the applied voltage from the electrodes 36 and 37, thereby causing the angular position of the platform 26 to drift over time. The present arrangement limits the exposed dielectric to the small vertical surface 44, which generates electrostatic field lines that do not significantly affect the field lines between the hot electrodes 36 and 37 and the ground plane 43. To further reduce the angular drift of the platform 26, the vertical surface 44 can be under cut beneath the ground plane 43 at a slight negative angle ensuring that the gap between the hot electrode 36 and the ground plane 43 is substantially zero. The ground plane 43 could also be positioned slightly below the hot electrodes 36 and 37 to create the vertical step.

Since the MEMs mirror devices 21, 22 and 23 are for use in optical devices, i.e. wavelength blockers and multiple wavelength switches (see FIG. 23), which include a grating for dispersing the light into spectral wavelength component channels, it is an important performance requirement that the spectral response has a high rejection of light between the selected wavelength channels. Unfortunately, in conventional MEMs devices, light passes between the mirrors and is reflected off the substrate back into the optical device, thereby leading to a deterioration in the isolation between the wavelength channels. Accordingly, the present invention provides back reflection cusps 50, defined by angled, curved or concave reflecting surfaces intersecting along a ridge, extending longitudinally below the gap between the platforms 26, for scattering any light passing between the mirrored platforms 26 in a direction substantially parallel to the surface of the platforms 26.

Figure 7:
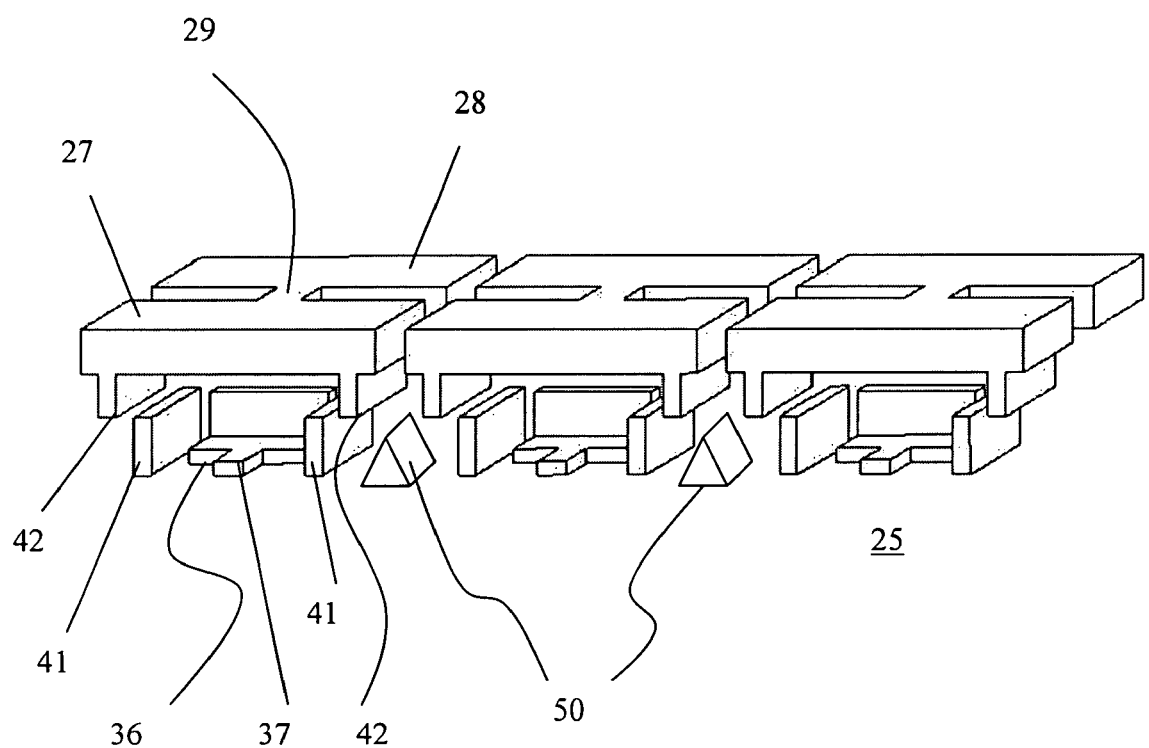
FIG. 7 is an isometric view of a plurality of Piano-MEMs mirror devices according to an alternative embodiment of the present invention with electrode shields.

To further eliminate cross-talk between adjacent electrodes, additional platform shields 42 (FIG. 7) can be added to the underside of the planar supporting regions 27 and 28, outside or inside of the electrode shields 41. Typically, in the rest position, the two different sets of shields 41 and 42 do not overlap; however, as the platform 26 tilts the platform shields 42b begin to overlap the grounding shielding 41. The added protection provided by overlapping shielding is particularly advantageous, when the tilt angle of the platform 26 is proportional to the voltage applied to the electrode 36 (or 37), such as in open loop configurations. Accordingly, the greater the tilt angle, the greater the required voltage, and the greater the amount of potential cross-talk, but consequently the greater the amount of shielding provided by the overlapping ground and platform shields 41 and 42, respectively. Back reflection cusps 50 are also provided for reasons hereinbefore discussed. A single structure 50 between adjacent electrodes can replace the pair of adjacent shields 41.

Figure 8:
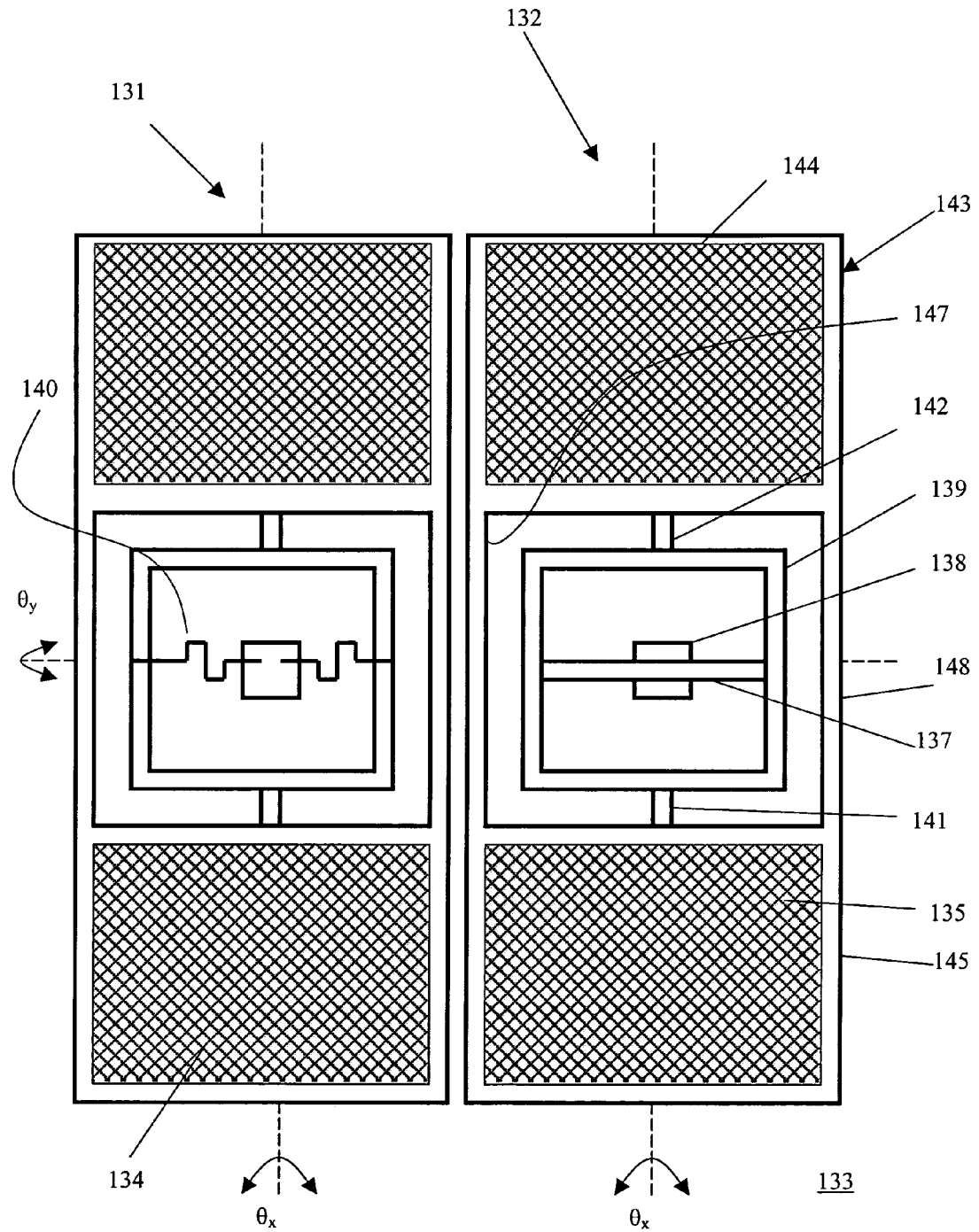
FIG. 8 is a plan view of a pair of internal gimbal ring MEMs mirror devices according to the present invention.

With reference to FIG. 8, a pair of internal gimbal ring MEMs mirror devices 131 and 132 are illustrated mounted adjacent each other on a substrate 133. The present invention enables mirrors 134 and 135 to be positioned relatively close together, i.e. with a high fill factor, while still providing the two degrees of motion provided by the more complicated prior art.

Figure 9:
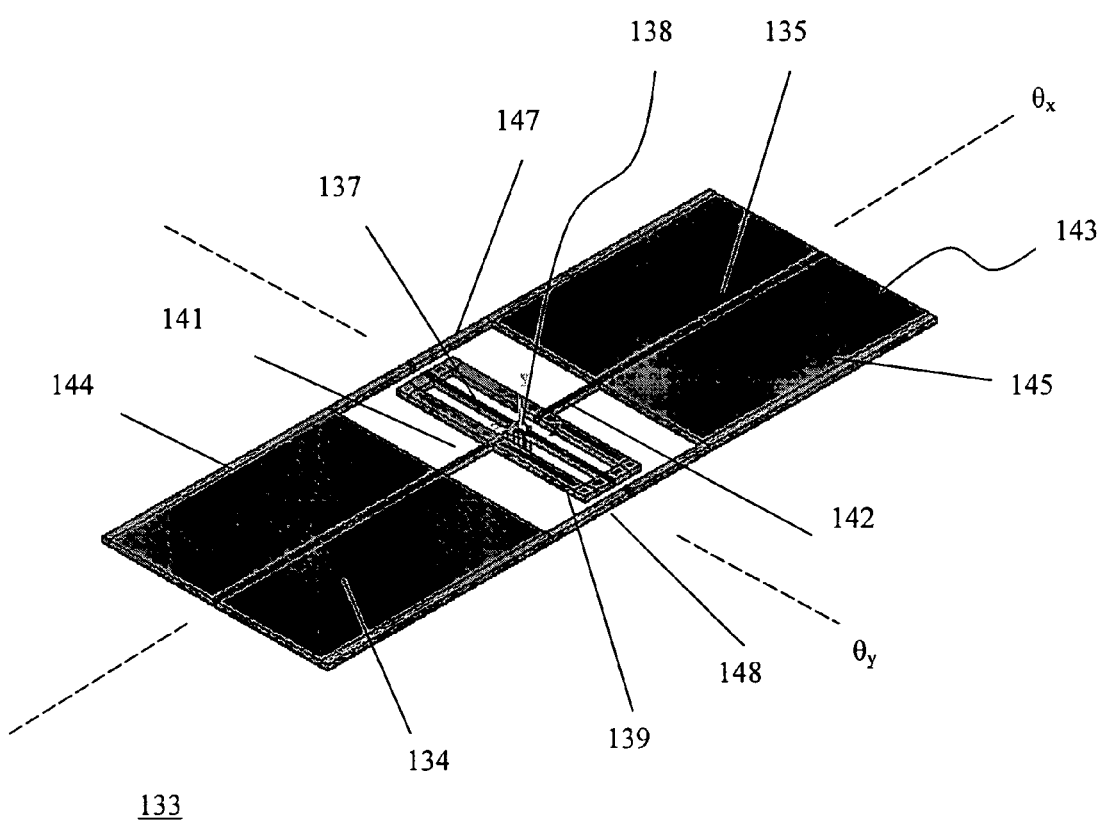
FIG. 9 is an isometric view of an internal gimbal ring MEMs mirror device according to the present invention.

With further reference to FIG. 9, a first torsion hinge 137, preferably in the form of a rectangular beam, is fixed, proximate the middle thereof, to the substrate 133 via a central anchor post 138. The supporting structure for the mirror device of the present invention is based on a single anchor post 138, rather than the dual anchor points required in the aforementioned external gimbal ring devices. The first torsion hinge 137 provides for rotation $\theta_y$ about a first axis Y, and may also include a serpentine hinge 140, as illustrated in mirror device 131, or any other torsional hinge known in the art. Opposite sides of an internal gimbal ring 139 are connected to opposite ends of the first torsion hinge 137, whereby the first torsion hinge 137 bisects the internal gimbal ring 139. The internal gimbal ring 139 is preferably not flexible, but can take various geometric forms, although rectangular or circular frames would be the most convenient to fabricate and use. Spring arms 141 and 142, which define a second torsion hinge, extend outwardly from opposite sides of the internal gimbal ring 139 perpendicular to the first torsion hinge 137. Each of the spring arms may also include a serpentine hinge as hereinbefore described. The second torsion hinge provides for rotation $\theta_x$ about a second axis X, which is perpendicular to the first axis Y, but still substantially in the same plane as the mirrors 134 and 135. A generally rectangular platform 143, for supporting one of the mirrors 134 or 135, is mounted on the ends of the spring arms 141 and 142. Preferably, the platform 143 is comprised of a pair of rectangular planar surfaces 144 and 145 joined together by a pair of elongated braces 147 and 148, which extend on either side of the internal gimbal ring 139 parallel with the spring arms 141 and 142.

Figure 1:
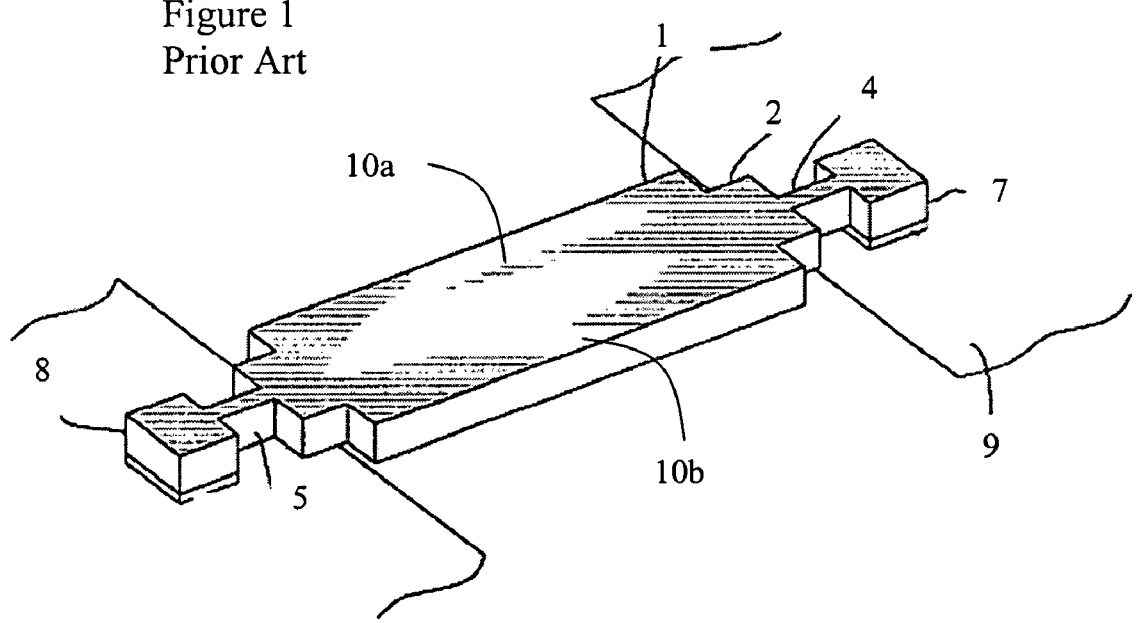
FIG. 1 is an isometric view of a conventional tilting MEMs mirror device.
Figure 2:
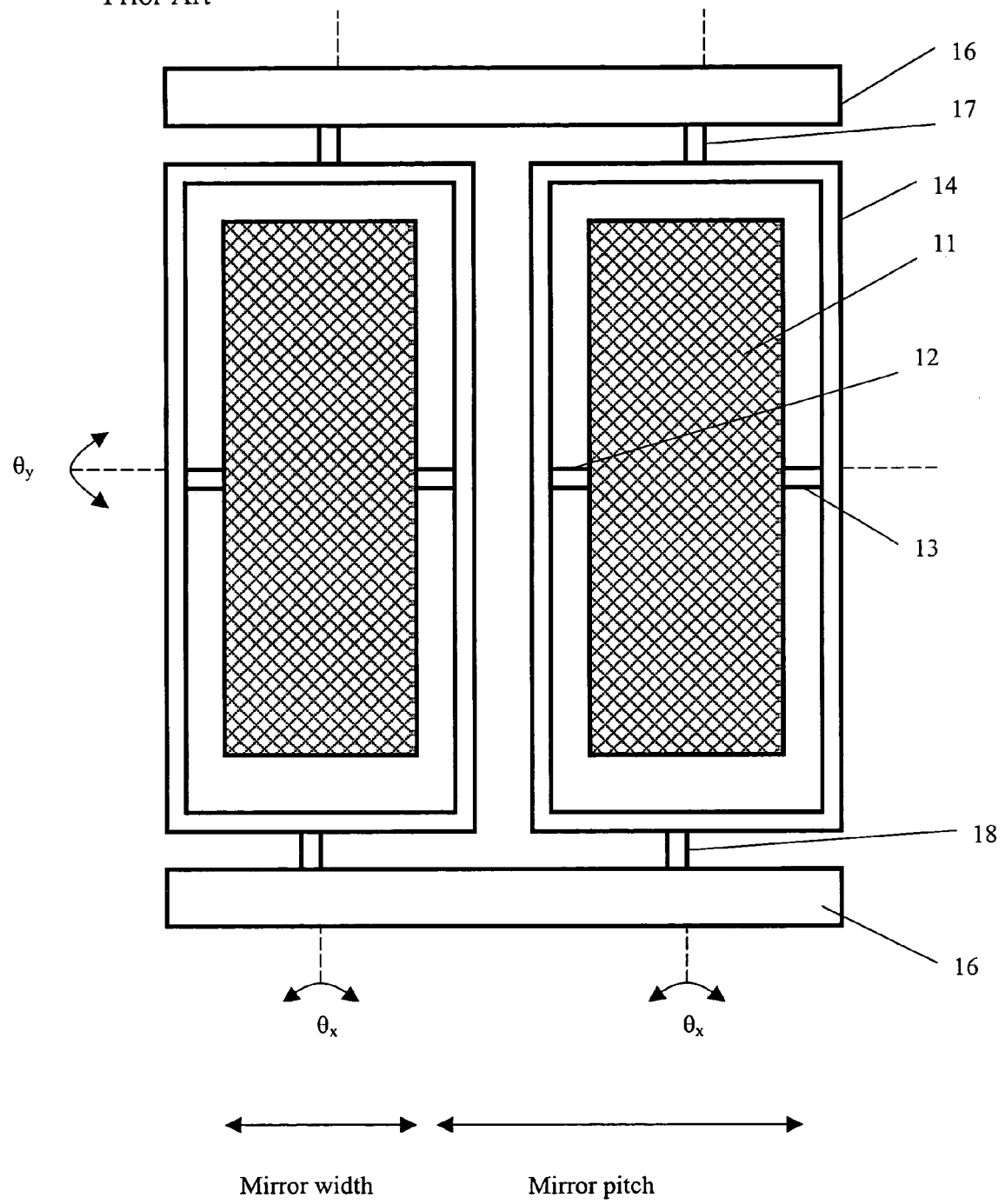
FIG. 2 is a plan view of a pair of conventional external gimbal ring MEMs mirror devices.

Fabrication of the preferred embodiment illustrated in FIGS. 8 and 9, is simplified by having all of the structural elements, i.e. the first torsional hinge 137, the gimbal ring 139, the spring arms 141 and 142, and the first and second planar surfaces 144 and 145, in the same upper substrate layer and having coplanar upper surfaces, whereby the same basic process steps are used as are used to fabricate the MEMs device illustrated in FIG. 1. In particular, a single photolithographic step is used to identify the structural elements, followed by a deep reactive ion etching (DRIE) step used to remove the unwanted portions of the upper substrate. Finally the moveable elements in the upper substrate are released from the lower substrate by removal of a sacrificial layer therebetween.

Figure 10:
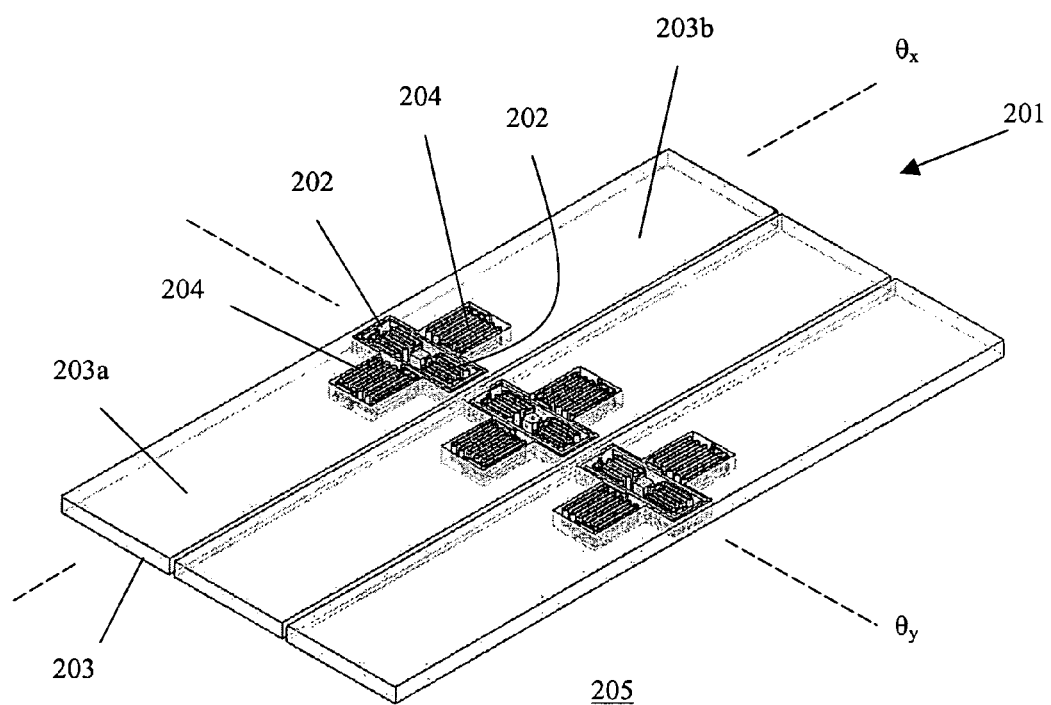
FIG. 10 is an isometric view of an alternative embodiment of the internal gimbal ring MEMs mirror devices according to the present invention.
Figure 11:
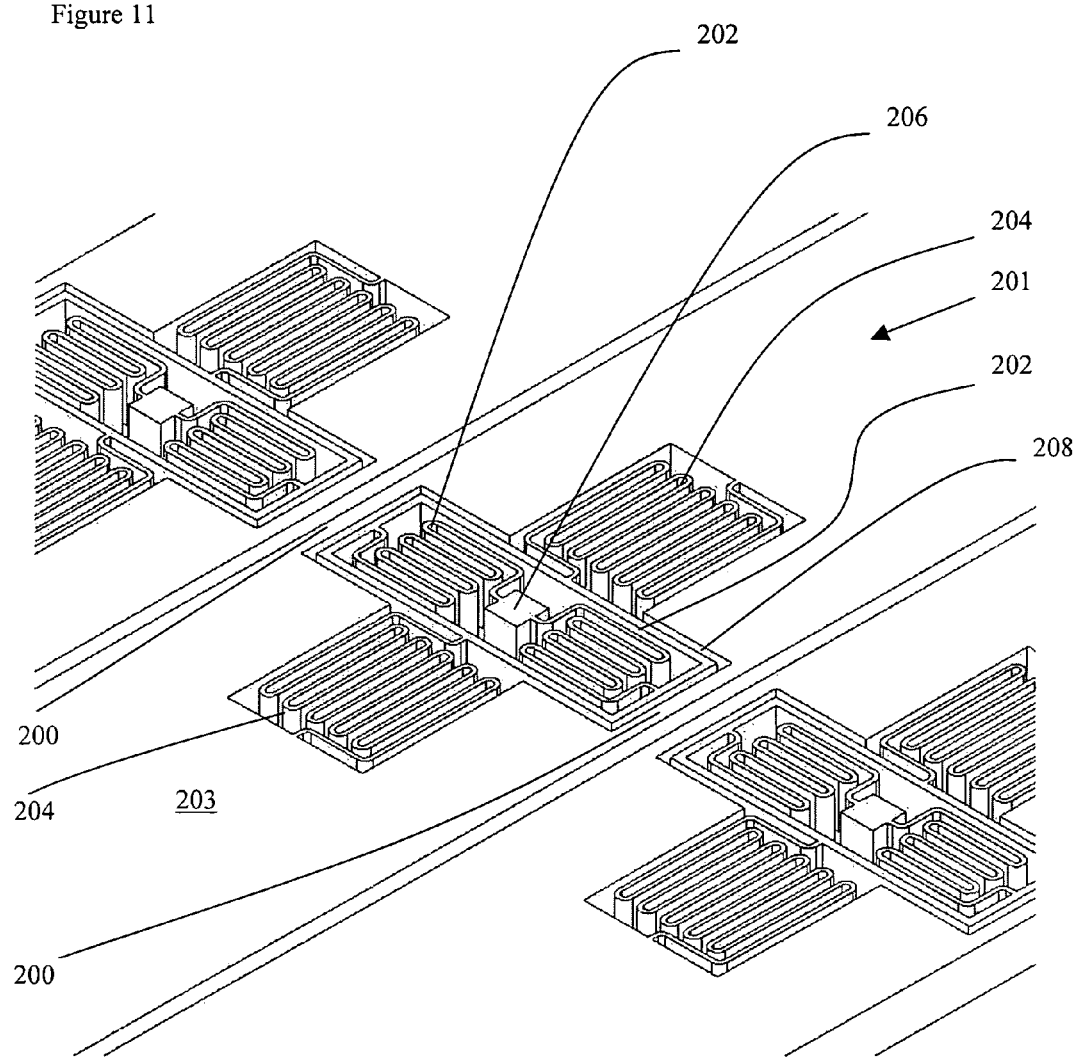
FIG. 11 is an isometric view of a hinge structure of the mirror devices of FIG. 9.

FIGS. 10 and 11 illustrate an array of internal gimbal ring MEMs mirror devices 201 utilizing a first pair of serpentine torsional hinges 202 for pivoting a rectangular platform 203, including first and second planar supporting regions 203a and 203b, about a first axis of rotation $\theta_x$, and a second pair of serpentine torsional hinges 204 for rotating the platform 203 about a second axis of rotation $\theta_y$ above a base substrate 205. The first pair of serpentine torsional hinges 202 extend from a single anchor post 206, which extends upwardly from the base substrate 205 through the center of the platform 203, i.e. at the intersection of the minor and major axes thereof. Outer ends of the first pair of torsional serpentine torsional hinges 202 are connected to a rectangular gimbal ring 208, which surrounds the first pair of serpentine hinges 202, at points along the minor axes ($\theta_y$) of the platform 203. The second pair of serpentine torsional hinges 204 extend from opposite sides of the gimbal ring 208 into contact with the platform 203, at points along the major axis ($\theta_x$) of the platform 203.

Figure 12:
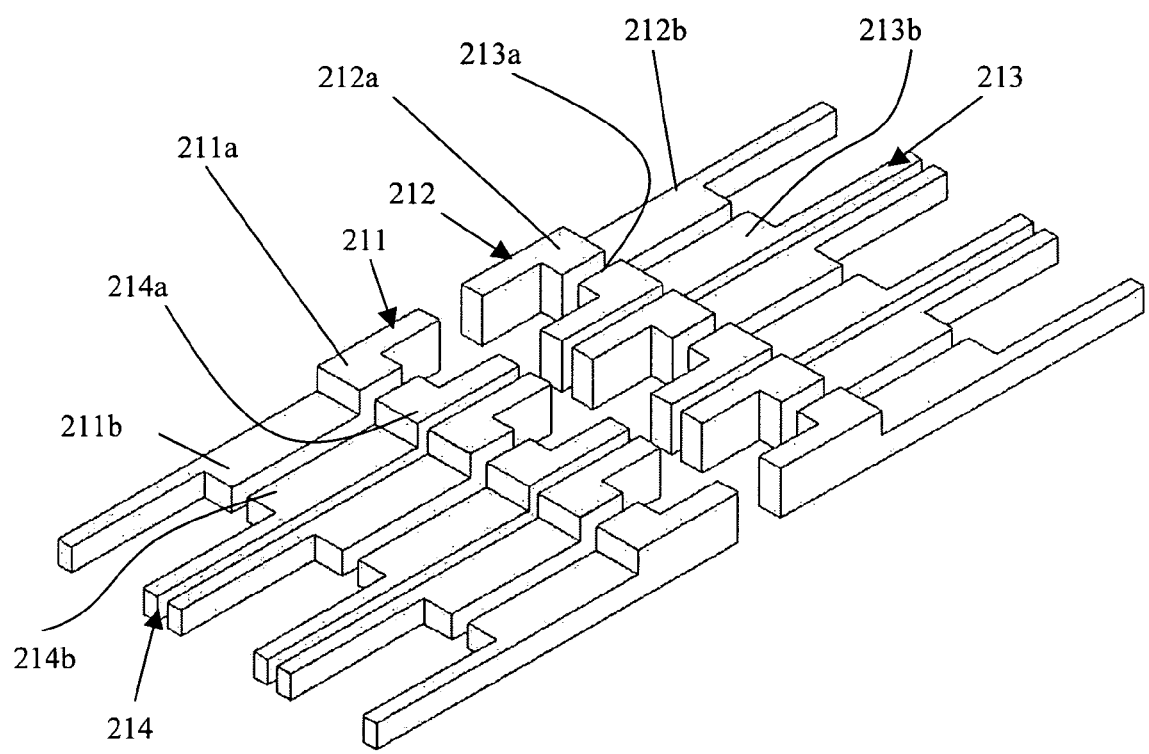
FIG. 12 is an isometric view of an electrode structure of the mirror devices of FIGS. 9 and 10.
Figure 13:
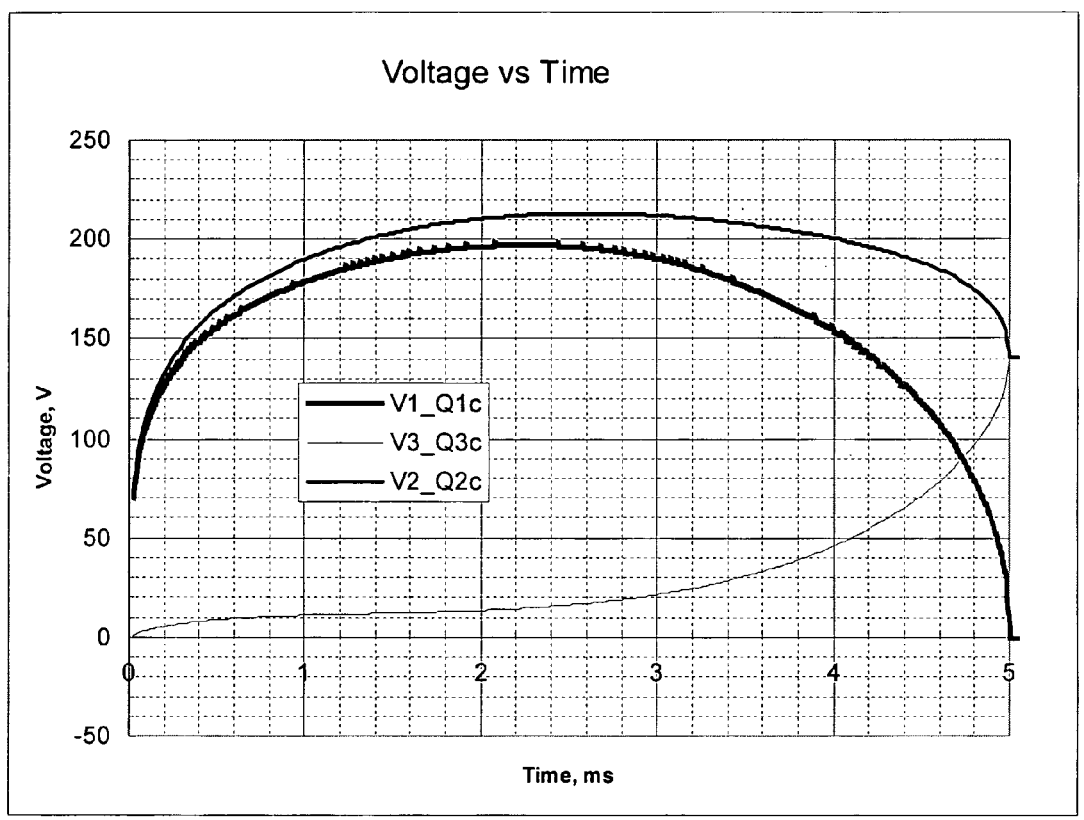
FIG. 13 is a graph of Voltage vs Time provided by the electrode structure of FIG. 11.

To provide a full range of motion for the platform 143 or 203, a set of four two-step electrodes 211, 212, 213 and 214 are provided (See FIG. 12); however, for the present invention only the first, second and third electrodes 211, 212 and 213 are required to roll the mirrors out of alignment with any intermediate output ports and then back into alignment with a designated output port. As in FIG. 5, each of the electrodes 211, 212, 213 and 214 include an upper step 211a, 212a, 213a, and 214a, and a lower step 211b, 212b, 213b, 214b, respectively, for reasons discussed hereinbefore. Accordingly, first, second and third voltages can be established between the platform 143 or 203 and the first electrode 211, the second electrode 212 and the third electrode 213, respectively. Initially, the first and second electrodes 211 and 212 are activated to rotate the platform 143 or 203 about $\theta_x$. Subsequently, the first voltage is gradually lowered to zero, while the third voltage is gradually increased until it is equivalent to the second voltage (See FIG. 13). To minimize unwanted effected caused by ringing, i.e. vibration of the mirrors caused by an abrupt start or stop, the first, second and third voltages are increased and decreased gradually, e.g. exponentially, as evidenced in FIG. 13, which illustrates the voltages curves for the various electrodes (first, second and third) over the actuation time of the mirror device. Various mirror tilting patterns can be designed based on the desired characteristics, e.g. attenuation, of the light.

Figure 14:
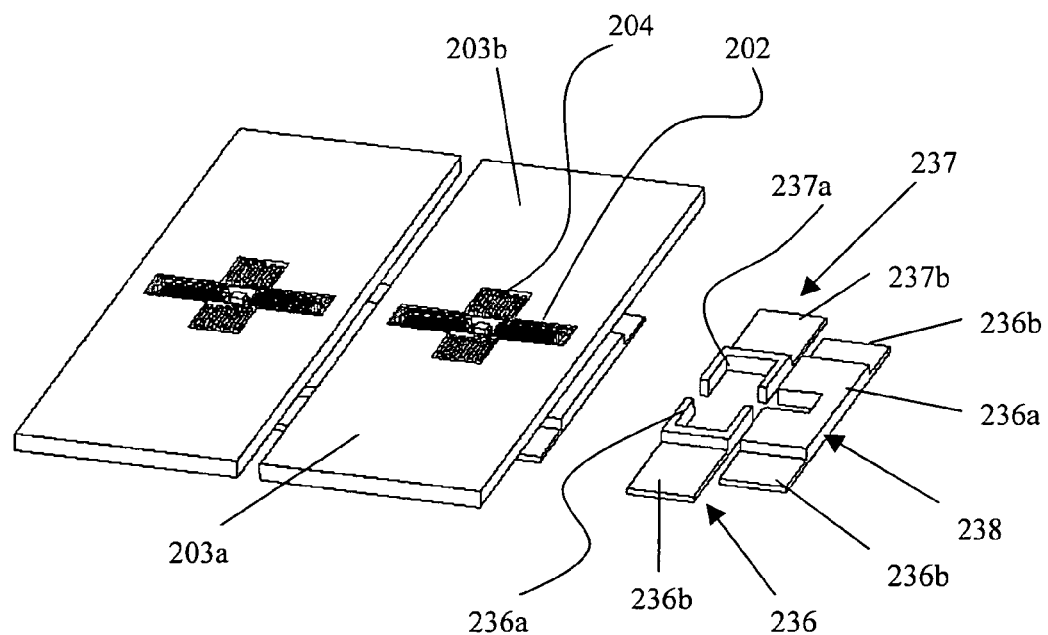
FIG. 14 is an isometric view of internal gimbal ring MEMs mirror devices utilizing a three electrode arrangement according to the present invention.
Figure 15:
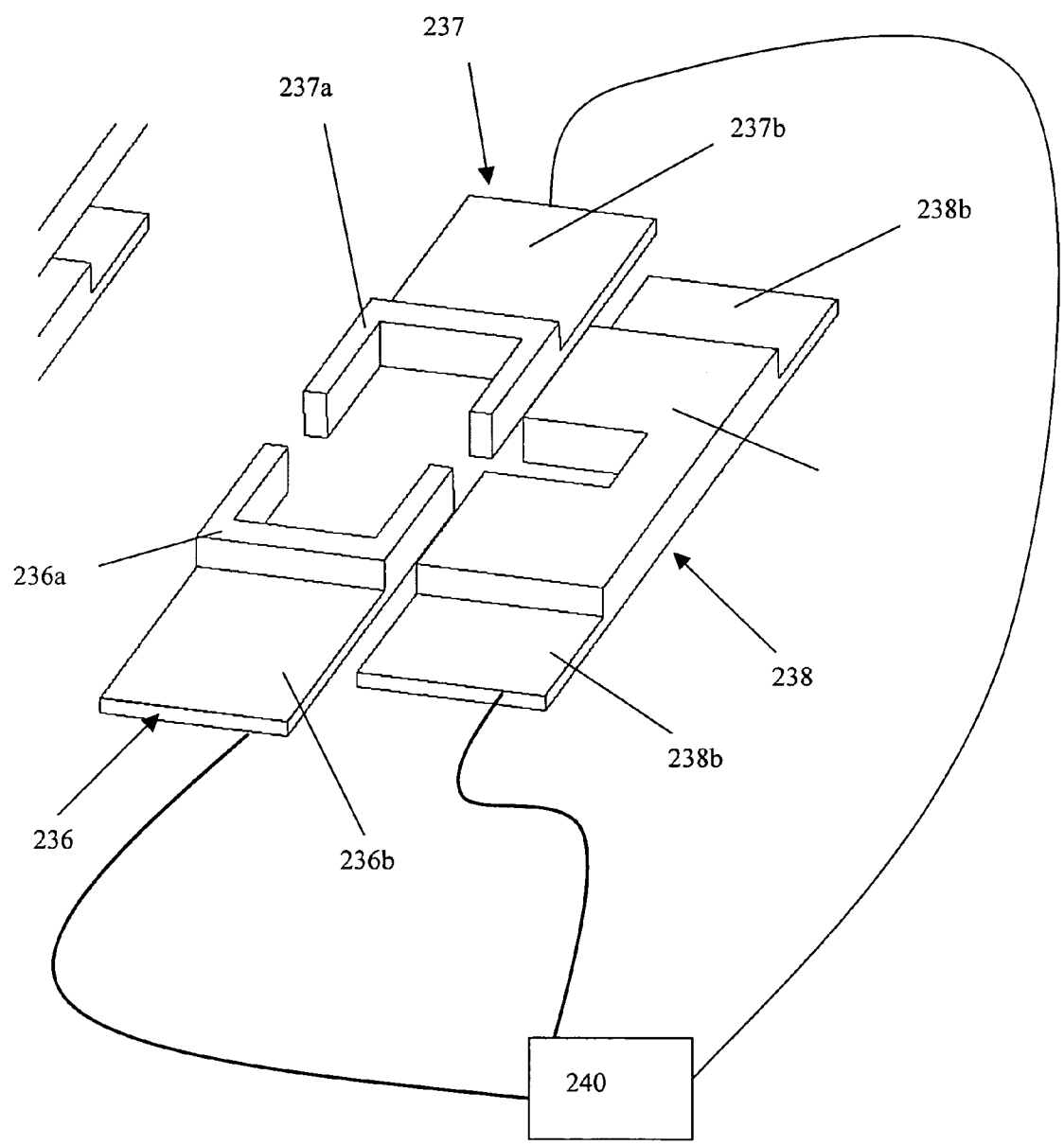
FIG. 15 is an isometric view of the three electrode arrangement of FIG. 14.

An improved electrode configuration is illustrated in FIGS. 14 and 15, in which a first two-step $\theta_y$ electrode 236 includes an upper U-shaped step 236a, and a lower rectangular step 236b. The arms of the U-shaped step 236a extend from the lower step 236b on opposite sides of the second hinge 204 beneath the first planar supporting region 203a. Similarly, a second two-step $\theta_y$ electrode 237 includes an upper U-shaped step 237a, and a lower rectangular step 237b. The arms of the U-shaped step 237a extend from the lower rectangular step 237b on opposite sides of the second hinge 204 beneath the second planar supporting region 203b. A single two-step $\theta_x$ electrode 238 includes an upper U-shaped step 238a, and lower rectangular steps 238b extending from each arm of the upper U-shaped step. The single $\theta_x$ electrode 238 extends from adjacent the first $\theta_y$ electrode 236 to adjacent the second $\theta_y$ electrode 237 across the gap therebetween, and beneath one side of both the first and second planar supporting regions 203a and 203b. The lower steps 238b provide a larger gap between the outer free ends of the platform 203, when the platform is tilted towards the first or the second $\theta_y$ electrode 236 or 237. The arms of the upper U-shaped step 238b extend on opposite sides of the first pair of hinges 202. The arms of the U-shaped step 238a are three to five times wider than the arms of the U-shaped step 236a or 237a. Multi-step electrodes are also possible to further spread the application of force over the length of the platform 203. Actuation of the electrodes is controlled by an electrode control 240, as will be discussed hereinafter with reference to FIG. 19.

Figure 16:
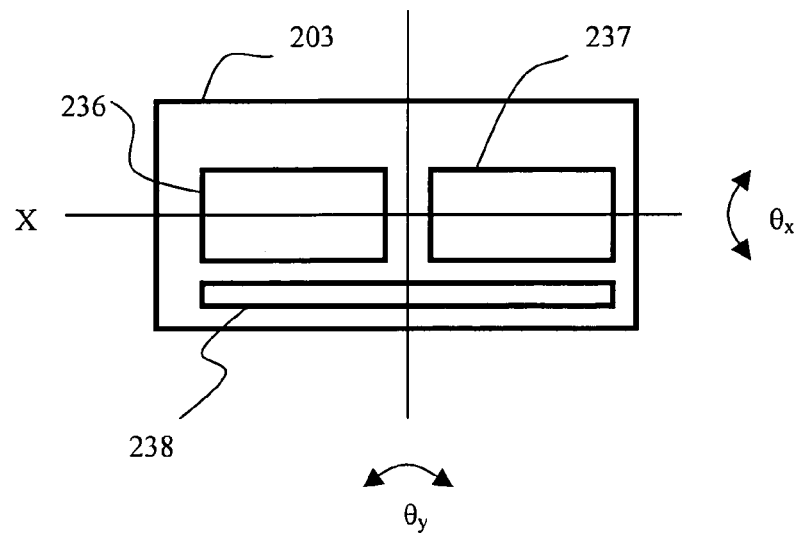
FIG. 16 is a plan view of an ideal placement of the three electrodes of FIGS. 14 and 15 relative to the pivoting platform.
Figure 17:
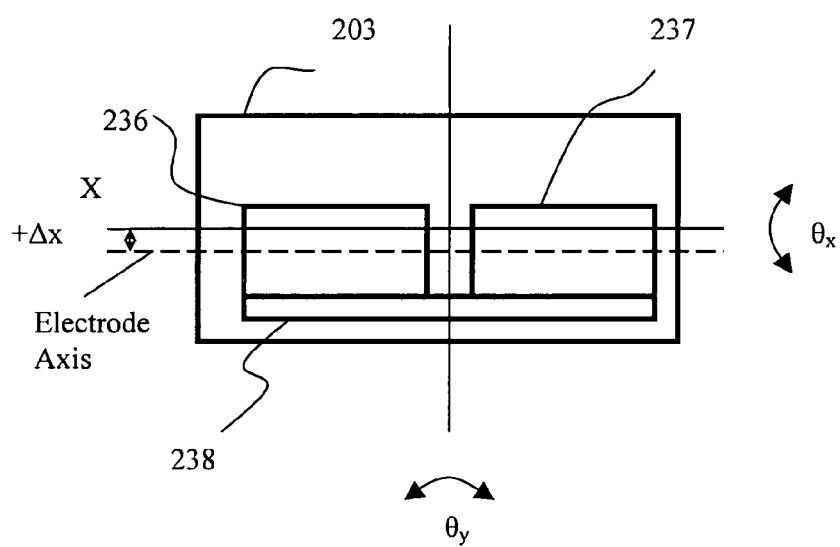
FIG. 17 is a plan view of a possible misalignment of the three electrodes of FIGS. 14 and 15.
Figure 18:
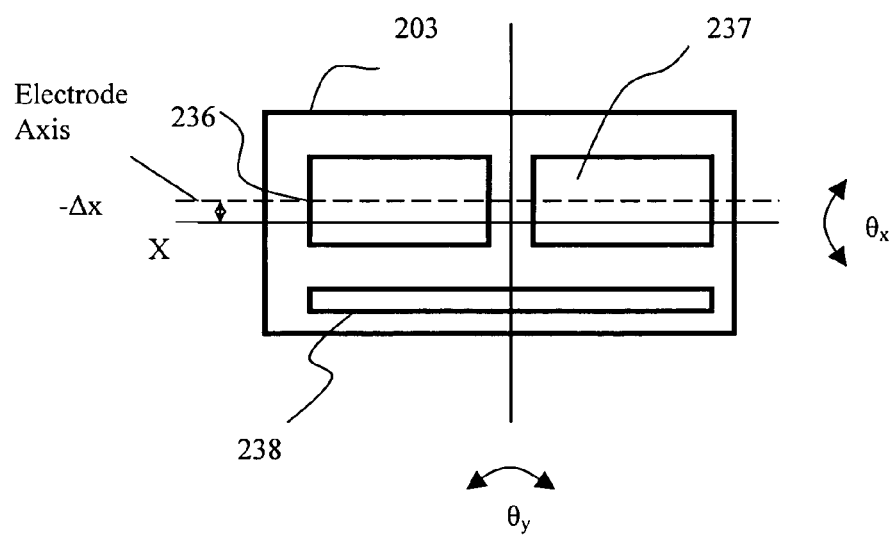
FIG. 18 is a plan view of another possible misalignment of the three electrodes of FIGS. 14 and 15.

An unfortunate consequence of relying on only three electrodes is that a slight misalignment in positioning the platform 203 over the first and second $\theta_y$ electrodes 236 and 237 can result in an imbalance that can not be corrected for using the single $\theta_x$ electrode 238. FIG. 16 illustrates the ideal case, in which the longitudinal axis of the first electrode 236 is aligned with the longitudinal axis X of the platform 203. However, FIG. 17 illustrates the results of a mask misalignment during fabrication, in which the longitudinal axis X of the platform 203 has a +Δx misalignment relative to the electrode axis. Accordingly, actuation of the first $\theta_y$ electrode 236 would introduce an undesirable tilt in the platform 203 towards the bottom left hand corner, which could not be compensated by the single $\theta_x$ electrode 238. In FIG. 18, the illustrated mask misalignment, in which the longitudinal axis X of the platform 203 has a −Δx misalignment relative to the electrode axis. In this case, actuation of the first $\theta_y$ electrode 236 would introduce an undesirable tilt in the platform 203 towards the top left hand corner. However, this tilt can be compensated for by applying a voltage to the single $\theta_x$ electrode 238. Accordingly, the solution to the problem of mask misalignment is to introduce an intentional or predetermined −Δx misalignment, which would cancel or at least minimize any +Δx misalignment and which could be compensated for by the single $\theta_x$ electrode 238.

Figure 19:
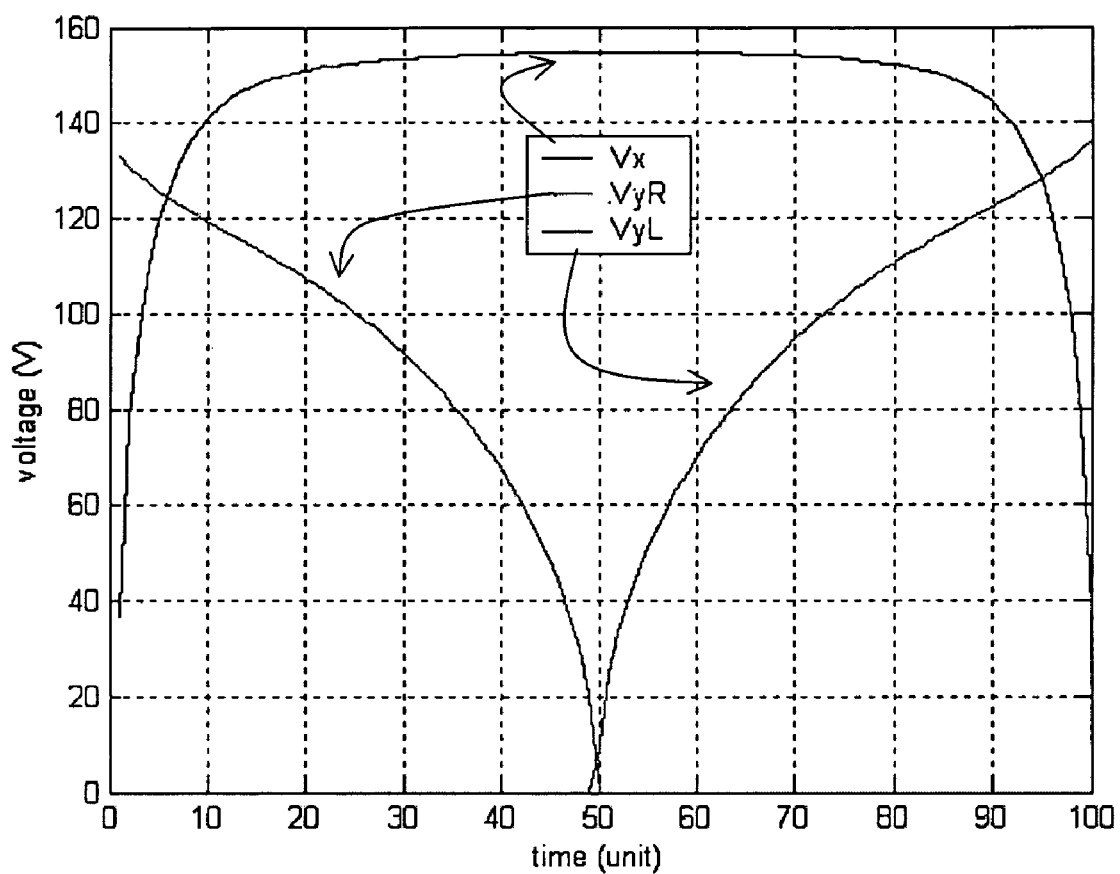
FIG. 19 is a graph of Voltage vs Time for the three electrodes of FIG. 14 and 15.

FIG. 19 illustrates an electrode voltage vs time graph, detailing the voltages of the three electrodes 236, 237 and 238 as the platform 203 is switched from one position to another by an electrode control, i.e. from reflecting light from one port to another, without traveling directly, i.e. without reflecting light into any intermediate ports. To prevent undesirable "ringing" of the platform 203, the voltage VyR of the first $\theta_y$ electrode 236 is gradually decreased as the voltage Vx of the single $\theta_x$ electrode 238 is increased. As the voltage VyR decreases to zero, the voltage VyL of the second $\theta_y$ electrode 237 gradually increases. As the voltage VyL reaches its set amount to maintain the platform in the desired position, the voltage Vx is decreased to a minimum amount, assuming no compensation voltages are required.

Figure 20:
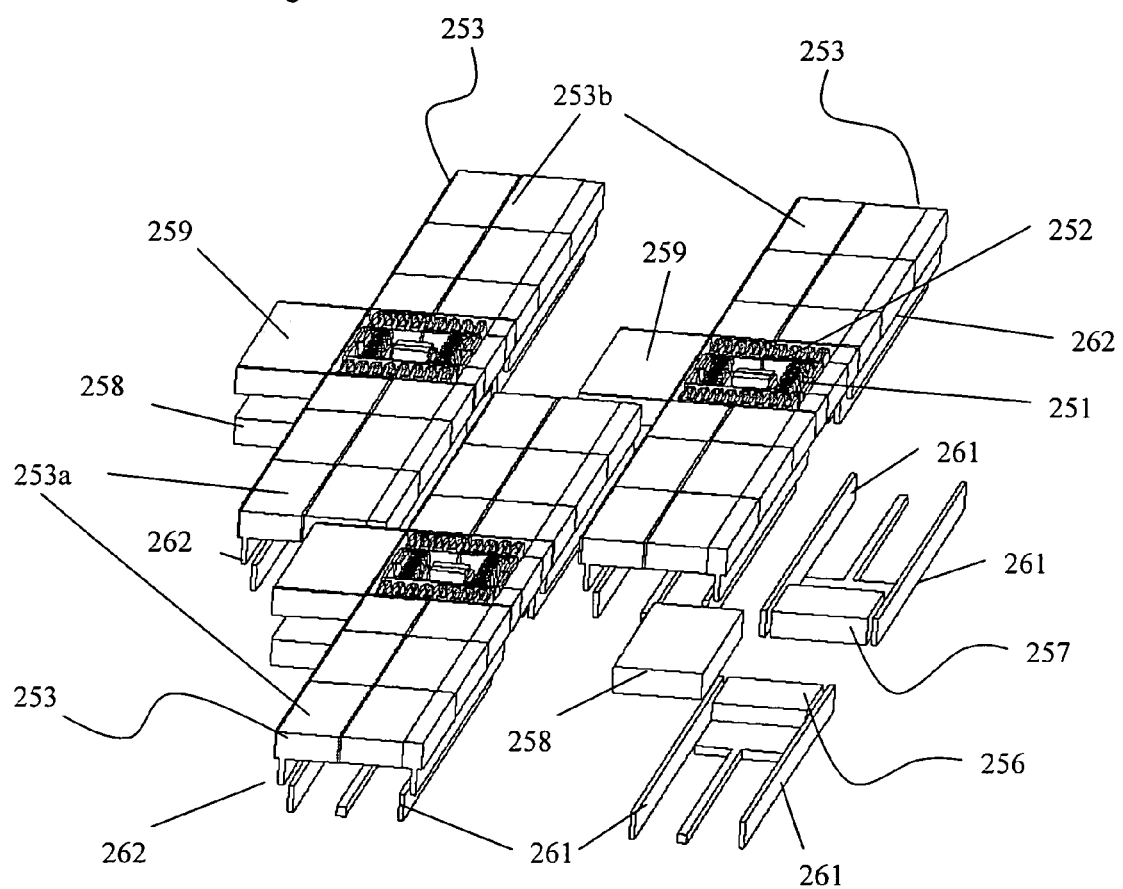
FIG. 20 is an isometric view of another embodiment of the present invention with an offset section on the pivoting member.
Figure 21:
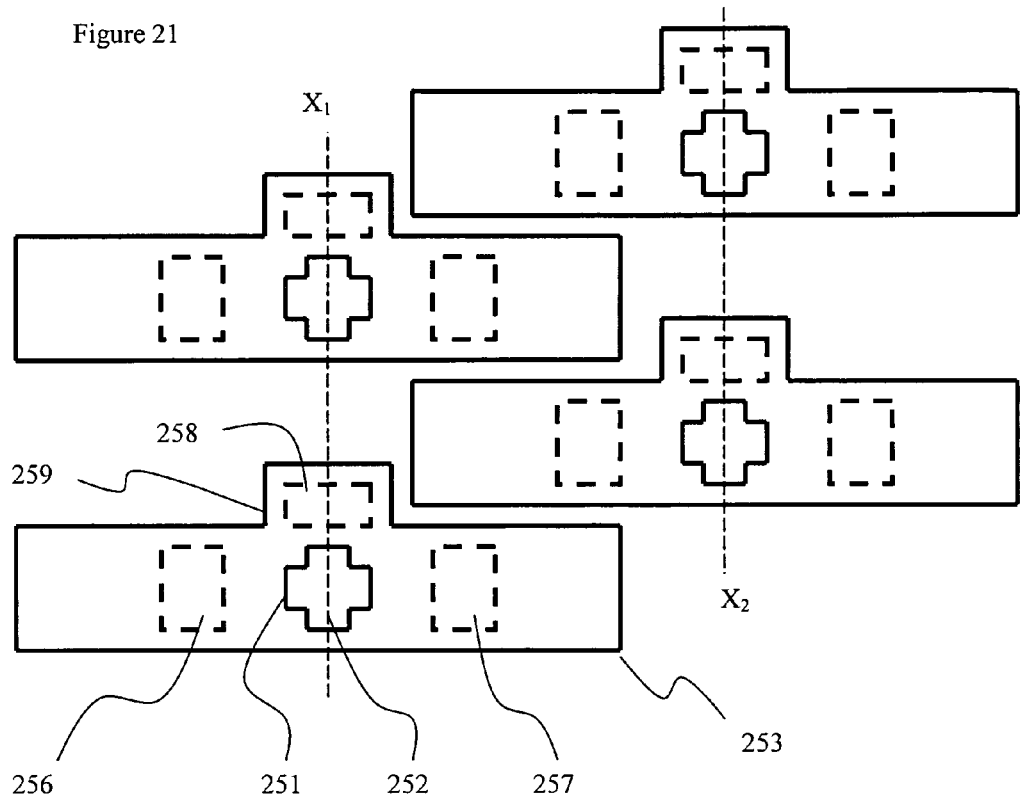
FIG. 21 is a plan view of the embodiment of FIG. 20.

When the size of the platform 203 is decreased, e.g. for small pitch micro-mirrors in the order of <100 um, the electrodes 236, 237 and 238 must also be constructed correspondingly smaller. However, due to the fact that the electrodes necessarily become thinner, while sharing the same mirror section, stable tilt angles are difficult to achieve at high resonant frequencies. Accordingly, the size requirement of the electrode, and the required electrode spacing become the limiting factor in determining the maximum fill factor. An alternative embodiment of a three electrode configuration is illustrated in FIGS. 20 and 21, in which platform 253 are made smaller than the original platforms 203 with first and second two-step $\theta_y$ electrodes 256 and 257 positioned therebelow. A single $\theta_x$ electrode 258 is positioned below each offset section 259, which extends from the side of the platforms 253 adjacent the mid-section thereof, i.e. the area of first and second hinges 251 and 252. This arrangement enables the single $\theta_x$ electrode 258 to be separated from the other two electrodes 256 and 257, and therefore, be larger in size, which enables the electrostatic torque to be increased for a common voltage. The added separation between the electrodes 256, 257 and 258 minimizes the angular instabilities, when the single $\theta_x$ electrode 238 is actuated, and reduces the amount of electrical x-talk. Preferably, the two-step $\theta_x$ electrodes 256 and 257 include the ground plane arrangement as disclosed in FIG. 6 with hot electrodes sunken relative to a surrounding ground plane, and only a vertically extending dielectric layer, which provides a substantially zero-width vertical gap between the hot electrode and the ground plane.

Figure 22:
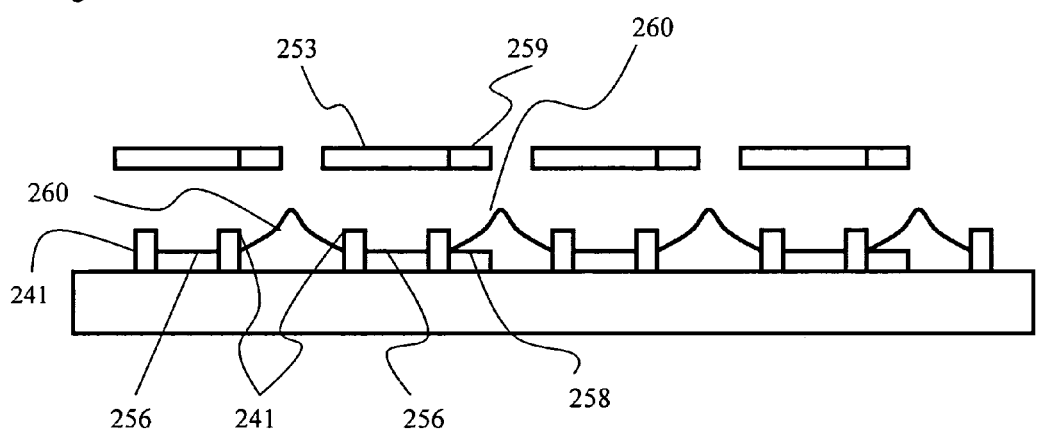
FIG. 22 is an end view of the embodiment of FIGS. 20 and 21.

For high fill factor applications, a first planar section 253a of one platform 253 is positioned beside a second planar section 253b of an adjacent platform 253, as in FIGS. 20 and 21, whereby adjacent mirrors have offset x axes $X_1$ and $X_2$, and every other platform pivots about the same x axis. Only the relatively closely disposed planar sections would require reflective material thereon, and reflective cusps 260 would only be required therebelow (FIG. 22).

Substrate-mounted, grounded cross-talk shields 261 and platform mounted cross-talk shields 262 are provided to further minimize the amount of electrical cross-talk between adjacent mirrors. The platform mount cross-talk shields 262 are preferably mounted outside of the platform mounted cross-talk shields 262 with enough spacing to enable rotation about both the x and the y axis; however, any combination for offsetting the shields 261 and 262 is possible.

Figure 23:
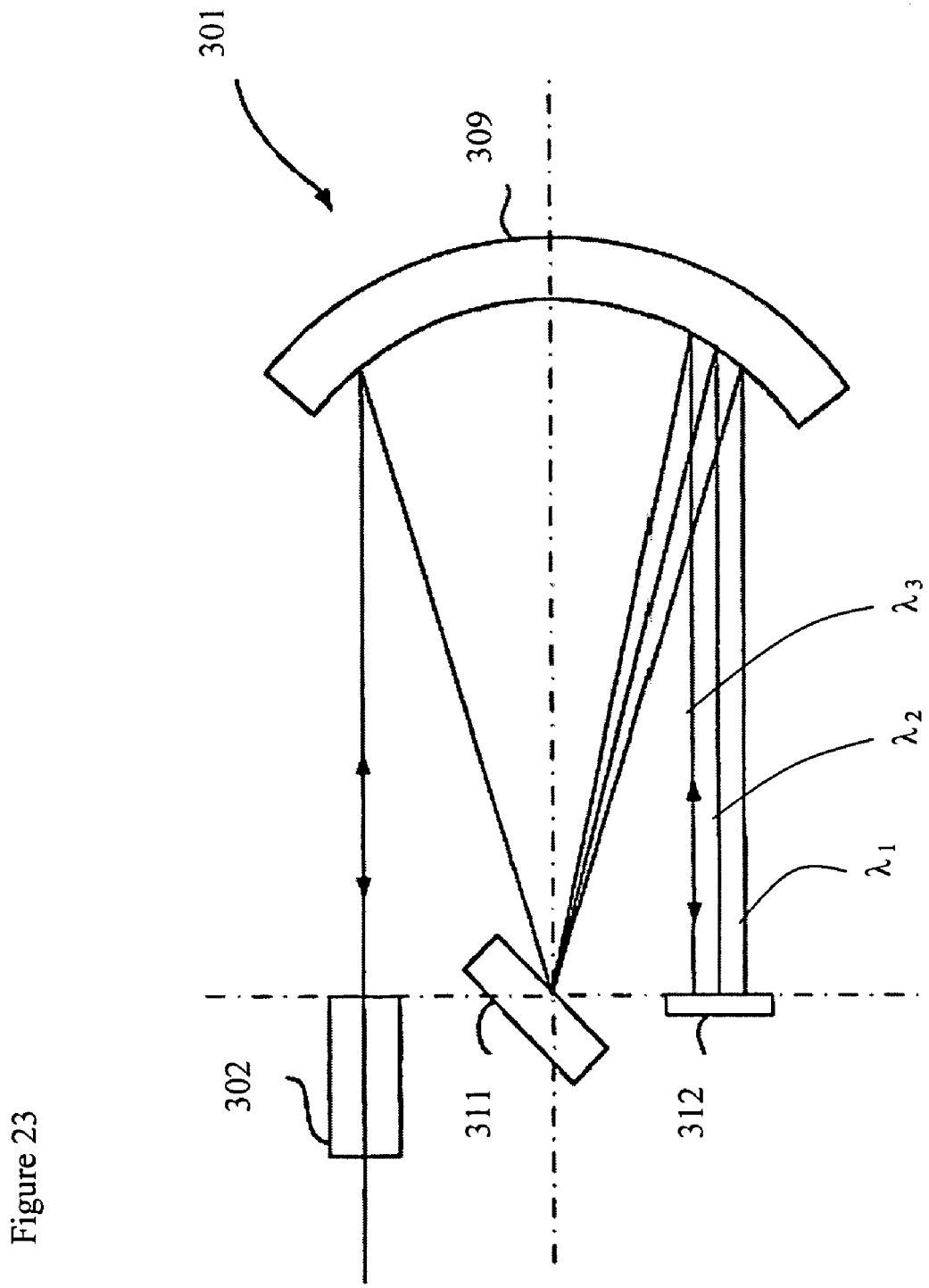
FIG. 23 is a schematic diagram of a wavelength switch utilizing the mirror devices of the present invention.
Figure 24:
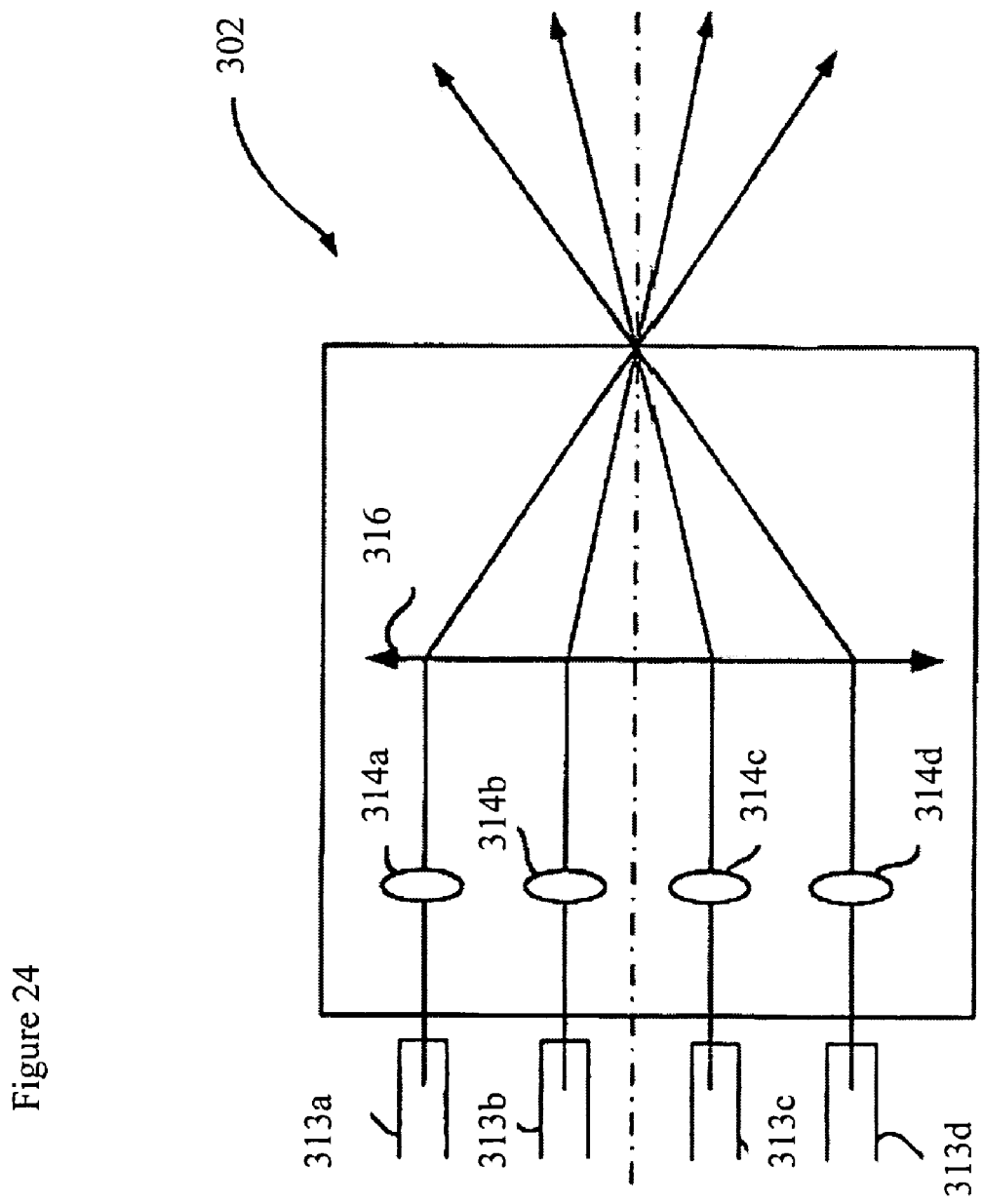
FIG. 24 is a schematic diagram of an input/output assembly for the wavelength switch of FIG. 23.
Figure 25:
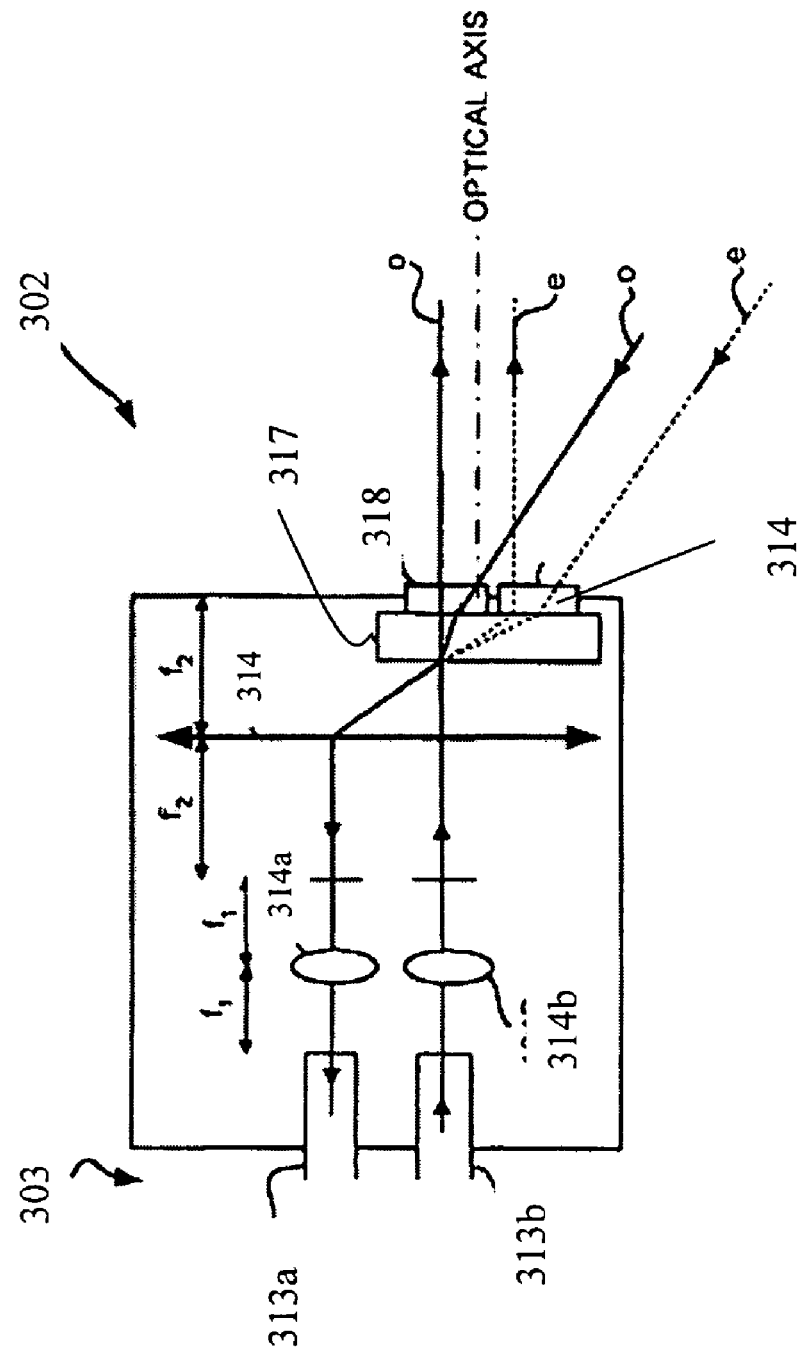
FIG. 25 is a schematic diagram of an alternative embodiment of an input assembly for the wavelength switch of FIG. 23.

The "piano" MEMs mirror devices according to the present invention are particularly useful in a wavelength switch 301 illustrated in FIGS. 23, 24 and 25. In operation, a beam of light with a plurality of different wavelength channels is launched via an input/output assembly 302, which comprises a plurality of input/output ports, e.g. first, second, third and fourth input/output ports 303, 304, 305 and 306, respectively. The beam is directed to an element having optical power, such as concave mirror 309, which redirects the beam to a dispersive element 311, e.g. a Bragg grating. The dispersive element separates the beam into the distinct wavelength channels ($\lambda_1$, $\lambda_2$, $\lambda_3$), which are again directed to an element having optical power, e.g. the concave mirror 309. The concave mirror 309 redirects the various wavelength channels to an array of "piano" MEMs mirror devices 312 according to the present invention, which are independently controlled to direct the various wavelength channels back to whichever input/output port is desired. Wavelength channels designated for the same port are reflected back off the concave mirror 309 to the dispersive element 311 for recombination and redirection off the concave mirror 309 to the desired input/output port. The concave mirror 309 can be replaced by a single lens with other elements of the switch on either side thereof or by a pair of lenses with the dispersive element 311 therebetween.

With particular reference to FIG. 24, the input/output assembly 302 includes a plurality of input/output fibers 313a to 313d with a corresponding collimating lens 314a to 314d. A single lens 316 is used to convert a spatial offset between the input/output ports into an angular offset. FIG. 25 illustrates a preferred embodiment of the input/output assembly, in which the unwanted effects of polarization diversity are eliminated by the use of a birefringent crystal 317 and a waveplate 318. For incoming beams, the lens 316 directs each beam through the birefringent crystal 317, which separates the beam into two orthogonally polarized sub-beams (o and e). The half waveplate 318 is positioned in the path of one of the sub-beams for rotating the polarization thereof by 90°, so that both of the sub-beams have the same polarization for transmission into the remainder of the switch. Alternatively, the waveplate 318 is a quarter waveplate and rotates one of the sub-beams by 45° in one direction, while another quarter waveplate 319 rotates the other sub-beam by 45° in the opposite direction, whereby both sub-beams have the same polarization. For outgoing light, the polarization of one (or both) of the similarly polarized sub-beams are rotated by the waveplate(s) 318 (and 319), so that the sub-beams become orthogonally polarized. The orthogonally polarized sub-beams are then recombined by the birefringent crystal 317 and output the appropriate input/output port. The micro-electro-mechanical devices according to the present invention are particularly well suited for use in switching devices with polarization diversity front ends, since they provide a pair of reflecting surfaces, i.e. one for each sub-beam

We claim:

1. A micro-electro-mechanical device mounted on a substrate comprising:
   a pivoting member pivotally mounted on said substrate about first and second axes, said pivoting member including a first and a second supporting region on opposite sides of said first axis;
   a first hinge extending from said substrate rotatable about the first axis;
   a gimbal ring connected to outer ends of said first hinge;
   a second hinge extending from said gimbal ring to said pivoting member rotatable about the second axis;
   a first electrode beneath the first supporting region for pivoting the pivoting member about the first axis;
   a second electrode beneath the second supporting region for pivoting the pivoting member about the first axis;
   a third electrode beneath a portion of said pivoting member along the first axis, adjacent said second hinge; and
   wherein said gimbal ring is disposed between said first and second supporting regions.

2. The device according to claim 1, further comprising electrode control means for gradually decreasing a voltage to said first electrode to a minimum, while increasing a voltage to said third electrode to a maximum, and then gradually increasing a voltage to said second electrode, while decreasing the voltage to said third electrode to a minimum, thereby indirectly rotating the pivoting member about the first axis.

3. The device according to claim 1, wherein a longitudinal axis of said first and second electrodes is offset from a longitudinal axis of said pivoting member on an opposite side of said third electrode to ensure any mask misalignment of said pivoting member and said first and second electrodes can be compensated by said third electrode.

4. The device according to claim 1, wherein said third electrode extends from adjacent said first electrode to adjacent said second electrode passed a gap therebetween.

5. The device according to claim 1, wherein the pivoting member includes an offset section extending from a side thereof, beneath which said third electrode is disposed.

6. The device according to claim 1, wherein said first and second hinges are positioned between said first and second supporting regions, whereby outer edges of said pivoting member are free of said hinges enabling adjacent pivoting members to be positioned in close proximity.

7. The device according to claim 6, wherein the first electrode includes arms extending on either side of said second hinge; and wherein the third electrode includes arms extending on either side of said first hinge.

8. The device according to claim 6, wherein the pivoting member includes an offset section extending from a side thereof adjacent the first and second hinges, beneath which said third electrode is positioned.

9. The device according to claim 1, further comprising shields disposed on each side of said first electrode for limiting the amount of electrical cross-talk between adjacent pivoting members.

10. The device according to claim 9, wherein the shields extend downwardly from an undersurface of said pivoting member.

11. The device according to claim 9, wherein the shields extend upwardly from the substrate above a top surface of the first electrode.

12. The device according to claim 9, wherein the shields extend upwardly from the substrate above a top surface of the first electrode, and downwardly from an undersurface of said pivoting member inside or outside of the upwardly extending shields.

13. The device according to claim 1, wherein said first electrode includes:
  a hot electrode; a trace electrically connecting said hot electrode to a power source;
  a ground plane covering said trace, thereby reducing the amount of force applied to an outer free end of said pivoting member.

14. The device according to claim 13, wherein the ground plane extends around the hot electrode at a level different than the hot electrode defining a substantially vertical surface therebetween, wherein the substantially vertical surface comprises a dielectric surface for isolating the hot electrode from the ground plane.

15. The device according to claim 13, wherein the ground plane extends around the hot electrode at a level higher than the hot electrode defining a substantially vertical surface therebetween, wherein the substantially vertical surface comprises a dielectric surface for isolating the hot electrode from the ground plane.

* * * * *